US00RE39230E

(19) United States
(12) Reissued Patent
Shimada

(10) Patent Number: US RE39,230 E
(45) Date of Reissued Patent: Aug. 8, 2006

(54) IC SOCKET FOR ELECTRICAL PARTS WITH IMPROVED ELECTRICAL CONTACT

(75) Inventor: Hideo Shimada, Kawaguchi (JP)

(73) Assignee: Enplas Corporation, Saitama (JP)

(21) Appl. No.: 10/207,818

(22) PCT Filed: Oct. 1, 1998

(86) PCT No.: PCT/JP98/04440

§ 371 (c)(1),
(2), (4) Date: Jun. 1, 1999

(87) PCT Pub. No.: WO99/18636

PCT Pub. Date: Apr. 15, 1999

Related U.S. Patent Documents

Reissue of:
(64) Patent No.: 6,296,503
Issued: Oct. 2, 2001
Appl. No.: 09/319,127
Filed: Jun. 1, 1999

(30) Foreign Application Priority Data

Oct. 3, 1997 (JP) ..... 9-287963
Nov. 28, 1997 (JP) ..... 9-344024

(51) Int. Cl.
*H01R 11/22* (2006.01)

(52) U.S. Cl. ..... 439/266
(58) Field of Classification Search ..... 439/266
See application file for complete search history.

(56) References Cited

U.S. PATENT DOCUMENTS 5,713,751 A * 2/1998 Fukunaga ..... 439/266

* cited by examiner

*Primary Examiner*—Javaid H. Nasri
(74) *Attorney, Agent, or Firm*—Staas & Halsey LLP

(57) ABSTRACT

An socket for an electrical part comprises a socket body provided with a mount portion on which an IC package as "electrical part" is mounted, a plurality of contact pins attached to the socket body so as to be electrically conductive to an IC lead of the IC package, and an upper operation member provided for the socket body to be vertically movable. The contact pins are provided with a stationary contact piece having a stationary contact portion contacting a lower surface of the IC lead and a movable contact piece having a movable contact portion contacting an upper surface of the IC lead, and when the upper operation member is vertically moved, the movable contact portion is displaced so as to be contacted to or separated from the terminal. In such an IC socket as "socket for an electrical part" contacted to or separated from the IC lead, the stationary contact piece of the contact pin is formed with an engagement portion to be engaged and the socket body is formed with an engaging portion for limiting the upper movement of the stationary contact piece in engagement with the engagement portion.

6 Claims, 14 Drawing Sheets

IC SOCKET FOR ELECTRICAL PARTS WITH IMPROVED ELECTRICAL CONTACT

Matter enclosed in heavy brackets [ ] appears in the original patent but forms no part of this reissue specification; matter printed in italics indicates the additions made by reissue.

TECHNICAL FIELD

The present invention relates to a socket for electrical parts for detachably holding electrical parts such as semiconductor device (which is called herein as "IC package") or the like.

BACKGROUND ART

A known socket for electrical parts of the type mentioned above, as shown in FIGS. 14 to 16, includes an IC socket 2 for holding an IC package 1 as "electrical part".

Such IC package 1 is so-called a gull-wing type, in which a plurality of IC leads 1b as "terminals" project sideways from a package body 1a having substantially a square shape.

The IC socket 2 has a socket body 3 which is provided with a mount portion 3a on which the IC package 1 is mounted, and a plurality of contact pins 4 capable of being elastically deformable so as to be contacted to the IC leads 1b of the IC package 1 in electrically conductive state are also formed to the socket body 3. Each of these contact pins 4 has a stationary contact piece 4a contacting the lower surface side of the IC lead 1b of the IC package 1 and a movable contact piece 4b contacting the upper surface side of the IC lead 1b in a manner such that the IC lead 1b of the IC package 1 is clamped between the stationary and movable contact pieces 4a and 4b.

The socket body 3 is also provided with an upper operation member 5 to be vertically movable in the following manner in an operative state. That is, when the upper operation member 5 is lowered against the urging force or elastic force of the contact pins 4 and a spring means, not shown, the movable contact piece 4b of the contact pin 4 is elastically deformed and then separated from the IC lead 1b, and on the contrary, when the upper operation member 5 is moved upward, the movable contact piece 4b is returned by the elastic force to thereby press the IC lead 1b from the upper portion thereof so as to clamp the IC lead 1b between this movable contact piece 4b and the stationary contact piece 4a.

However, in the conventional socket of the structure mentioned above, when the IC socket 2 is mounted to a printed circuit board, not shown, if an external force is applied to the contact pin 4 from the lower side thereof, the contact pin 4 is raised upward as shown in FIGS. 15 and 16, and there may cause such defect that a position of a stationary contacting portion 4c of the stationary contact piece 4a is raised or inclined, which results in a deterioration of electrical conductivity to the IC lead 1b and a deformation thereof.

Accordingly, it is an object of the present invention is to provide a socket for electrical parts which is capable of preventing the contact pins from being raised and positioning the stationary contact pin and other elements in their correct positions.

Furthermore, although the conventional IC socket mentioned above adopts two-point-contact-type contact pins, an IC socket 6 shown in FIGS. 17 and 18 adopts one-point-contact-type contact pins 7.

The IC socket 6 has a socket body 8 having a mount portion 8a on which the IC package 1 having a rectangular shape is mounted and also having guide portions 8b at positions corresponding to the corner portions of the IC package 1 for positioning the IC package 1 to a predetermined position. Partition wall sections 8c are formed at the peripheral edge portion of the mount portion 8a so as to project upward and a plurality of slits 8d are formed to the partition wall section 8c with predetermined pitches.

The socket body 8 is also formed with a plurality of elastically deformable contact pins 7 which are contacted to or separated from the IC leads 1b of the IC package 1. Each of the contact pins 7 has a movable contact piece 7a contacted to or separated from the upper surface of the IC lead 1b of the IC package 1, and these contact pins 7 are inserted into slits 8d, respectively, to be vertically movable, formed to the partition wall sections 8c.

Furthermore, as not shown in FIGS. 17 and 18, an upper operation member such as shown in FIG. 14 is provided for the socket body 8 to be vertically movable. When this upper operation member is lowered against urging force of a spring and contact pins 7, springy (elastic) portions of the contact pins 7 are elastically deformed thereby to separate the movable contact pieces 7a from the IC leads 1b, and on the other hand, when the upper operation member is raised, the springy portions are returned by their elastic force and the movable contact pieces 7a contact the upper surfaces of the IC leads 1b, as shown in FIG. 17, and press the IC lead 1b from the upper side thereof, thus establishing an electrical conduction between the contact pin 7 and the IC lead 1b.

However, in the conventional IC socket of the structure mentioned above, as the IC package has been made compact, a number of IC leads projecting from the package body have to be arranged with narrow pitch and narrow width. In other words, if the width of the IC lead 1b is not made narrow, it is impossible to arrange a number of IC leads 1b with a constant interval from each other. Accordingly, when such IC package 1 is mounted on the mount portion 8a of the socket body 8, the IC leads 1b, each having narrow width, intrude into the slits 8d formed to the partition wall sections 8c formed to the peripheral edge portion of the mount portion 8, resulting in the deformation or damage of the IC leads 1b and undesired mounting thereof.

Accordingly, another object of the present invention is to provide a socket for electrical parts having a structure capable of preventing terminals of electrical parts such as IC package from intruding into slits formed to the partition wall sections of the socket body and, hence, preventing the terminals from being deformed, damaged and undesirably mounted.

[DISCLOSURE] *SUMMARY* OF THE INVENTION

To achieve the above objects, the present invention of the first aspect is characterized by providing a socket for an electrical part which comprises a socket body provided with a mount portion on which an electrical part is mounted, a plurality of contact pins attached to the socket body so as to restrict a lower movement thereof and connected to a terminal of the electrical part to be electrically conductive, and an upper operation member provided for the socket body to be vertically movable, and in which each of the contact pins is provided with a stationary contact piece having a stationary contact portion contacting a lower surface of the terminal and a movable contact piece having a movable contact portion contacting an upper surface of the terminal, and the movable contact portion is displaced by vertically moving the upper operation member so as to be contacted to or separated from the terminal, wherein the stationary contact piece of the contact pin is formed with an engagement portion to be engaged and the socket body is formed with an engaging portion for limiting the upper movement of the stationary contact piece in engagement with the engagement portion.

According to the present invention mentioned above, since the engagement portion to be engaged is formed to the stationary contact piece of the contact pin and this engagement portion is engaged with the socket body as engaging portion for limiting the upward movement of the stationary contact piece, in a case where an upward external force is applied to the contact piece, the engagement portion of the stationary contact piece of the contact pin is engaged with the engaging portion of the socket body thereby to limit the upward movement thereof, so that the contact pin never raise, different from the prior art, and the position of the stationary contact portion is never raised and tilted, thus maintaining the attitude thereof in a correct position. Accordingly, when the terminal of an electrical part is mounted to the contact surface of the stationary contact portion, a suitable contacting state can be realized, and there is no cause of deformation of the terminal and conduction failure.

Another invention of this aspect is characterized in that, in the above invention, the socket body comprises a base member to which the contact pins are attached and a seating plate to which the mount portion is formed, the seating plate being formed with the engaging portion, and when the seating plate is mounted to the base member, the engagement portion of the contact pin is engaged with the engaging portion.

According to this invention, the assembling workability of the socket body can be improved by setting the engagement portion of the contact piece engaged with the engaging portion formed to the seating plate at a time when the seating plate is attached to the base member.

A further invention of this aspect is characterized in that, in the above invention, the seating plate is formed with a guide portion for guiding the stationary contact piece so as to engage the engagement portion of the contact pin with the engaging portion of the seating plate when the seating plate is mounted to the base member.

According to this invention, the engagement portion of the stationary contact piece can be easily engaged with the engaging portion of the seating member only by mounting the seating plate to the base member.

A further invention of this aspect is characterized in that, in the above invention, the stationary contact piece is formed with a springy portion which is elastically deformed against a force in a vertical direction.

According to this invention, the contact pin can be prevented from raising by the elastic force of the springy portion, and even if a molding error or assembling error to the contact pin and socket body be caused, such error could be absorbed by the elastic deformation of the springy portion.

The present invention of the second aspect is characterized by providing a socket for an electrical part which comprises a socket body provided with a mount portion on which an electrical part is mounted, a plurality of contact pins attached to the socket body so as to restrict a lower movement thereof and connected to a terminal of the electrical part to be electrically conductive, and an upper operation member provided for the socket body to be vertically movable, and in which each of the contact pins is provided with a movable contact piece contacting the terminal, the socket body is formed with a partition wall section formed around the mount portion and formed with a slit into which the movable contact piece is inserted, and the movable contact piece is displaced by vertically moving the upper operation member so as to be contacted to or separated from the terminal, wherein a width of the slit is formed to be smaller than a width of the terminal so as to prevent the terminal of the electrical part from intruding into the slit with the electrical part being mounted on the mount portion.

According to this invention, since the width of the slit of the socket body is made smaller than the width of the terminal of the electrical part to be mounted on the mount portion of the socket body, the terminal of the electrical part never intrude into the slit of the socket body at a time when the electrical part is mounted on the mount portion, thus preventing the terminal from being deformed or erroneously mounted.

Another invention of this second aspect is characterized in that the contact piece is formed so that a width of the movable contact piece to be inserted into the slit is made smaller than a width of an elastically deformable springy portion of the contact pin.

According to this invention, the contact pin is formed such that the portion which is inserted into the slit is formed thinner than the elastically deformable portion thereof, so that the spring force of a portion to be elastically deformed can be ensured and the contacting force of the movable contact piece of the contact pin to the terminal of the electrical part can be ensured.

A further invention of this second aspect is characterized in that the slit is formed so that a width of a portion thereof on the side of the mount portion on which the electrical part is mounted is made smaller than the width of the terminal and is formed so as to provide a tapered-shape to be widened apart from the mount portion and the contact pin is formed so that the movable contact piece to be inserted into the slit is tapered toward the front end thereof.

According to this invention, the terminal of the electrical part such as IC package can be more surely prevented from intruding into the slit formed to the partition wall section of the socket body.

DETAILED DESCRIPTION OF THE INVENTION

Best Mode for Embodying The Invention

Exemplary Embodiments of the present invention will be described hereunder.

First Embodiment 1

Figure 1:
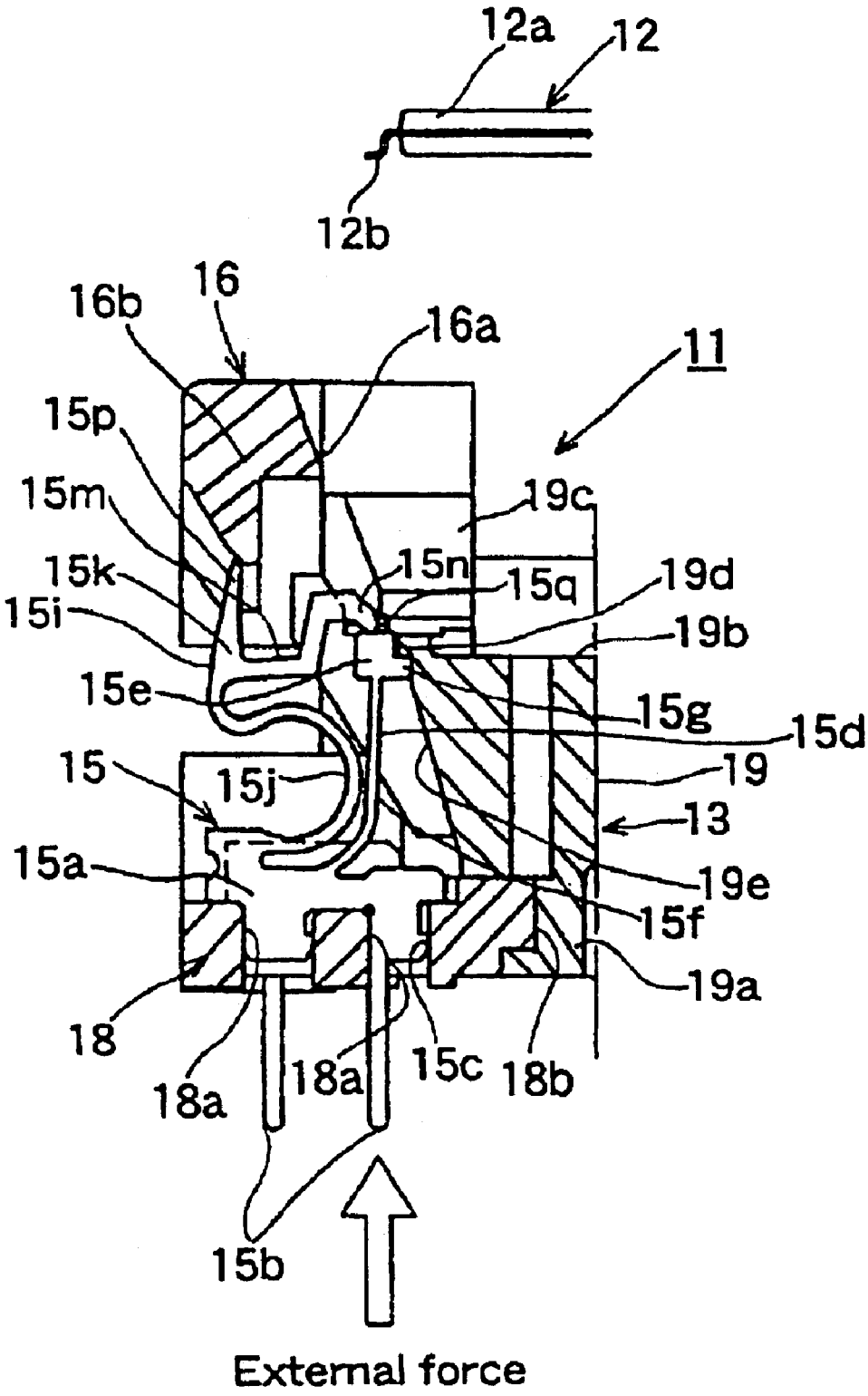
FIG. 1 is a sectional view, of an IC socket according to a first embodiment 1 of the present invention, taken along a perpendicular direction of the IC socket.
Figure 2:
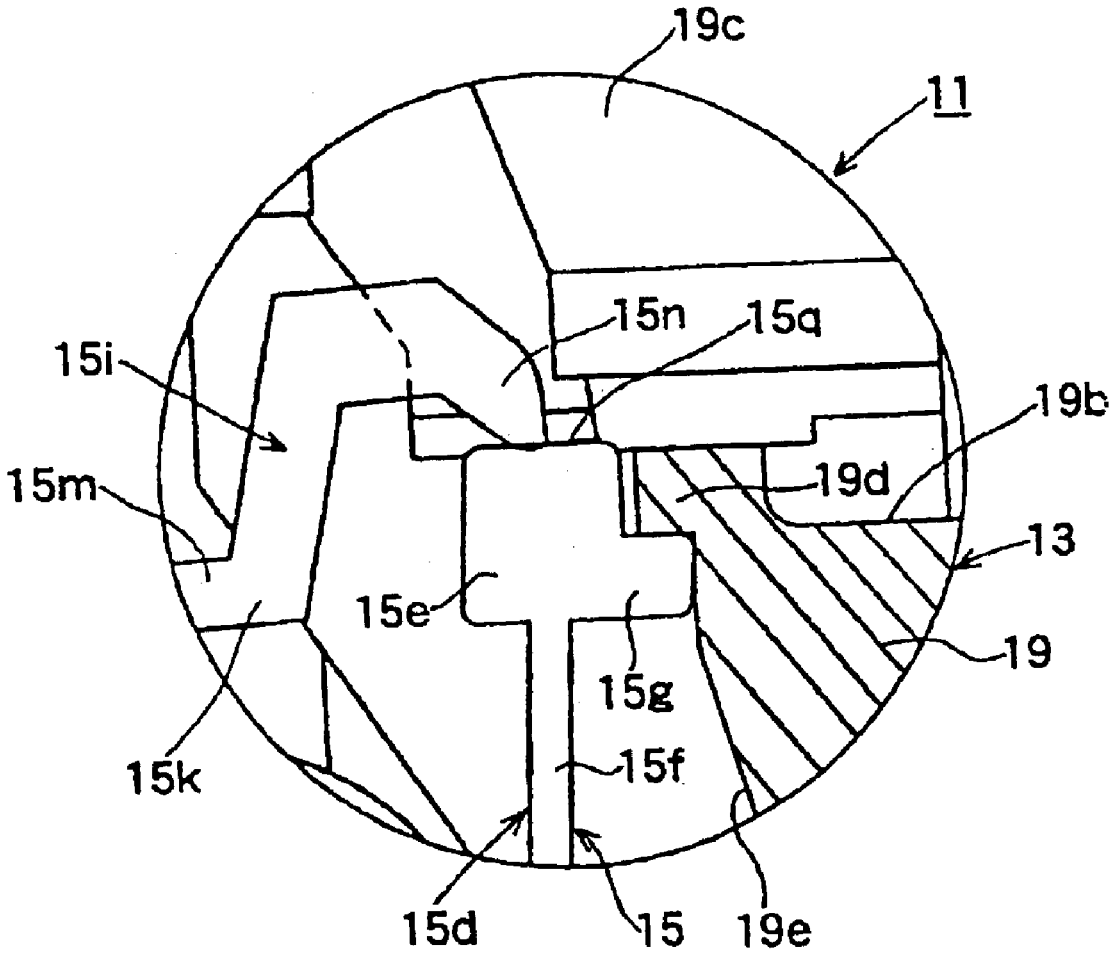
FIG. 2 is an enlarged view of an essential portion in the first embodiment 1.
Figure 3:
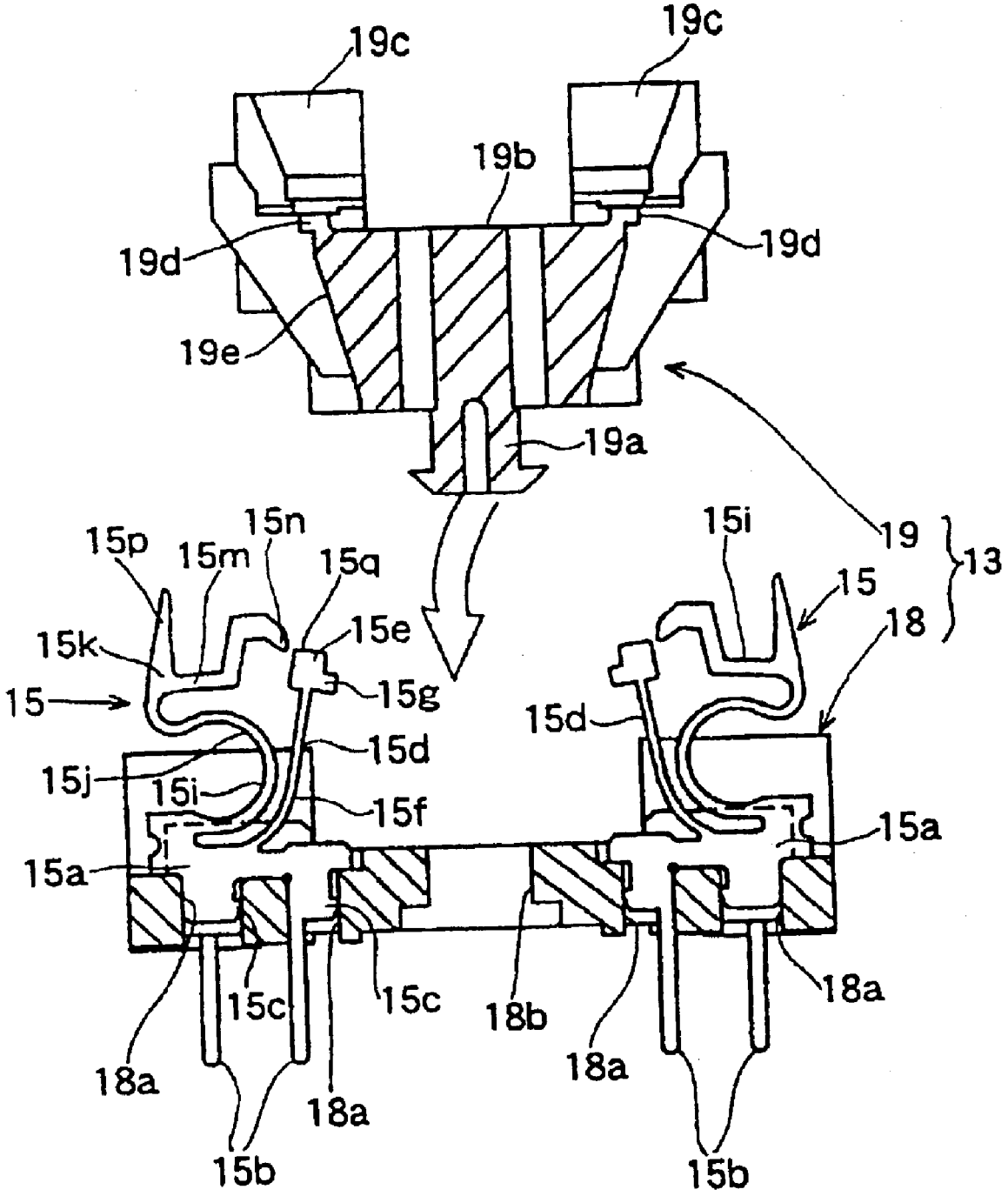
FIG. 3 is a sectional view showing a developed state of a base member and a seating plate of the first embodiment 1.

FIGS. 1 to 3 represent a first embodiment 1 of the present invention.

A structure of the first embodiment will be first explained. Reference numeral 11 in the figures denotes an IC socket as "socket for electrical parts", and the IC socket 11 is adapted to establish an electrical connection between IC leads 12b as "terminals" of an IC package 12 and a printed circuit board, not shown, of a measuring device such as tester for carrying out a performance test of the IC package 12 as "electrical part".

The IC package 12 is so-called a gull-wing type having substantially a rectangular shape such as shown in FIG. 1, in which a plurality of IC leads 12b projecting sideways from the side portion of the rectangular package body 12a.

The IC socket 11 is generally provided with a socket body 13 to be mounted on the printed circuit board. A plurality of contact pins 15, which are elastically deformable and electrically conductive to the IC leads 12b, are formed to the socket body 13, and an upper operation member 16 having a rectangular frame-like structure for elastically deforming these contact pins 15 is also formed to the socket body 13 to be vertically movable.

The socket body 13 has a base member 18 to which the contact pins 15 are mounted and a seating plate 19 attached to the base member 18.

The base member 18 is formed with press-in holes 18a into which the contact pins 15 are fitted under pressure and a fitting hole 18b into which the seating plate 19 is fitted.

The seating plate 19 is provided with a fitting projection 19a, at its lower central portion, to be fitted to the fitting hole 18b of the base member 18 and a mount portion 19b, at its upper portion, on which the IC package 12 is mounted. Guide portion 19c for positioning the IC package 12 to a predetermined position are also formed to the mount portion 19b at portions corresponding to respective corner portions of the package body 12a. Still furthermore, an engaging portion 19d to be engaged with the contact pin 15 is also formed to the peripheral portion of the mount portion 19b of the seating plate 19.

The contact pin 15 is formed of a material having a springy property and a superior conductivity, and a plurality of contact pins 15 are arranged adjacent to each other by being press-fitted into the holes 18a formed to the base member 18 of the socket body 13.

More in detail, each of the contact pins 15 has a base portion 15a and lead portion 15b projecting downward from the base portion 15a. The lead portion 15b has, at its root portion, a claw portion 15c contacted under pressure to an inner wall of the press-in hole 18a and the lower end portion of the base portion 15a abuts against the upper surface of the base member 18 in a manner that the contact pin 15 is fitted under pressure into the hole 18a in a state being restricted in its downward movement with respect to the base member 18. A portion of the lead portion 15b projecting downward from the socket body 13 is electrically connected to the printed circuit board.

The base portion 15a is formed, at its upper side, with a stationary contact piece 15d having an upper end portion to which a stationary contact portion 15e which contacts the lower surface side of the IC lead 12b is formed and the base portion 15a is also formed, to a further lower portion, with a springy portion 15f elastically deformable by a vertically applied force. The stationary contacting portion 15e is formed with an engagement portion 15g which is engageable with the lower surface side of the engaging portion 19d of the seating plate 19.

A movable contact piece 15i is formed outside the stationary contact piece 15d so as to project upward. The movable contact piece 15i is formed with a curved springy portion 15j and a movable piece 15k connected to the curved springy portion 15j. An arm portion 15m extending inward is formed to the movable piece 15k and a movable contact portion 15n is formed to the front end portion of the arm 15m so as to contact the upper surface of the IC lead 12b, which is hence clamped by this movable contact portion 15n and the stationary contact portion 15e mentioned before. Further, an operation piece 15p is formed to the movable contact piece 15k so as to project upward.

The upper operation member 16 is formed, as shown in FIG. 1, with an opening 16a having a size allowing the IC package 12 to be inserted. The IC package 12 is inserted through the opening 16a and mounted on the mount portion 19b of the socket body 13. The upper operation member 16 is arranged to the socket body 13 to be vertically movable and urged upward by a spring means, not shown. Furthermore, the upper operation member 16 is formed with a cam portion 16b slidably contacting the operation piece 15p of the contact pin 15. When the upper operation member 16 is moved downward, the operation piece 15p of the contact pin 15 is pressed by the cam portion 16b and the curved springy portion 15j of the movable contact piece 15i is thereby elastically deformed. Accordingly, the movable piece 15k is deformed outward in an obliquely upward direction and hence opened, whereby the movable contact portion 15n is separated from the IC lead 12b. On the other hand, when the upper operation member 16 is moved upward, the movable contact portion 15n is deformed in an obliquely downward direction through the operation reverse to that mentioned above, whereby the IC lead 12b is clamped by the movable contact portion 15n and the stationary contact portion 15e, thus establishing an electrical connection therebetween.

The IC socket 11 of the structure mentioned above will be used in the following manner.

First, the lead portion 15b of the contact pins 15 of the IC socket 11 are inserted into insertion holes formed to the printed circuit board and then soldered thereto, and through such process, a plurality of IC sockets 11 are arranged on the printed circuit board.

Then, the IC package 12 is set to such IC socket 11 so as to establish the electrical connection therebetween by an automatic machine in the following manner.

That is, the upper operation member 16 is depressed downward, to lower the same, against the urging force of the spring and the contact pin 15 by means of the automatic machine with the IC package 12 being held. Then, the operation piece 15p is pressed by the cam portion 16b of the upper operation member 16, the springy portion 15j is elastically deformed, and the movable piece 15k is displaced obliquely upward to be maximally opened thereby to be retired from the IC package insertion range.

Under the condition mentioned above, the IC package 12 is released from the automatic machine and then mounted on the mount portion 19b of the socket body 13.

In such case, the IC package 12 is positioned to a predetermined position by the guide portion 19c, and the IC leads 12b of the IC package 12 are surely mounted on the upper surfaces 15q, as contact surfaces, of the stationary contact portion 15e of the contact pins 15.

Thereafter, when the pressing force of the upper operation member 16 by the automatic machine is released, the upper operation member 16 is moved upward by the elastic force of the contact pins 15 and the urging force of the spring, the movable pieces 15k of the contact pins 15 start to be returned, and when the upper operation member 16 is moved upward to the predetermined position, the movable contact portion 15n of the contact pin 15 contacts the upper surface of a predetermined IC lead 12b which is positioned in a manner mentioned above, and the IC lead 12b is clamped between the movable contact portion 15n and the stationary contact portion 15e thereby to realize the electrical connection therebetween.

Hereunder, the assembling method of the IC socket 11 of the structure mentioned above will be described.

First, as shown in FIG. 3, the contact pins 15 are press-fitted into the fitting holes 18a of the base member 18 and mounted thereto, in which the stationary contact pieces 15d are slightly tilted inward.

From the state mentioned above, the fitting projection 19a of the seating plate 19 is fitted, from the upper portion thereof, to the fitting hole 18b of the base member 18, and at the time of being fitted, the portion 15g to be engaged of the stationary contact piece 15d of the inwardly tilted contact pin 15 slides on the tapered surface 19e as "guide portion" for the seating plate 19, and hence, the stationary contact piece 15d is elastically deformed outward. Then, the engagement portion 15g of the stationary contact piece 15d guided on the tapered surface 19e abuts against the lower side of the engaging portion 19d of the seating plate 19 and is then engaged therewith.

As mentioned above, through the guidance of the engagement portion 15g of the stationary contact piece 15d by means of the tapered surface 19e, the engagement portion 15g can be easily engaged with the lower side of the engaging portion 19d only by fitting the seating plate 19 to the base member 18.

Under this state, when the springy portion 15f of the stationary contact piece 15d is elastically deformed, the stationary contact portion 15e of the stationary contact piece 15d is pressed against the engaging portion 19d of the seating plate and then engaged therewith. Accordingly, the stationary contact portion 15e is positioned to the predetermined position and the upper surface 15q of the stationary contact portion 15e takes a correct attitude along the horizontal direction.

In the structure mentioned above, in a case where an upward external force is applied to the lead portion 15b of the contact pin 15 from the printed circuit board or the like, since the engagement portion 15g of the stationary contact piece 15d of the contact pin 15 is engaged with the lower surface of the engaging portion 19d of the seating plate 19 to restrict the upward movement thereof, the contact pin 15 is not raised upward, different from the prior art structure, the position of the stationary contact portion 15e is also not raised, and hence, it is not tilted thereby to maintain the correct attitude.

Accordingly, in the case where the IC leads 12b is mounted on the upper surface 15q of the stationary contact portion 15e, a proper contacting condition can be realized, whereby the IC leads 12b are not deformed and the conduction failure is not caused.

Furthermore, by providing the springy portion 15f to the contact pin 15, the rising of the contact pin 15 by the elastic force of the springy portion 15f can be prevented from causing, and in addition, even if the formation error or assembling error be caused to the contact pin 15 and the socket body 13, such errors can be absorbed by the elastic deformation of the springy portion 15f.

Second Embodiment 2

FIGS. 4 through 12 represent a second embodiment 2 of the present invention.

An IC socket 21 as "electrical part" in this second embodiment 2 is, as like as the first embodiment 1, is provided with a socket body 23 to be mounted to a printed circuit board, and a mount portion 23a, on which the IC package 12 is mounted, is formed to the socket body 23 and guide portions 23b for positioning the IC package 12 to the predetermined position are provided at portions corresponding to corner portions of the package body 12a. Furthermore, partition wall sections 23c are formed each between the respective guide portions 23b around the mount portion 23a, and a number of slits 23d are formed to the partition wall sections 23c with predetermined distance therebetween (details will be described hereinlater).

A number of elastically deformable contact pins 25, which can be contacted to or separated from the IC leads 12b, are disposed to the socket body 23, and an upper operation member 26 having a rectangular frame-like shape for elastically deforming the contact pins 25 is also disposed to the socket body 23 to be vertically movable.

As shown in FIG. 4, FIG. 5, FIG. 8, FIG. 9, etc., the contact pins 25 have springy property, are formed of a material having a superior conductive property and are disposed on the outside positions of the mount portion 23a of the socket body 23 by being press-fitted. More in detail, each of the contact pins 25 has a base portion 25a and a lead portion 25b projecting downward from the base portion 25a.

The lead portion 25b is press-fitted to the socket body 23 and a portion of the lead portion 25b projecting downward over the socket body 23 is electrically connected to the printed circuit board mentioned hereinbefore. A movable piece 25d is formed above the base portion 25a through a curved springy portion 25c, an arm portion 25e is also formed so as to extend inward from the movable piece 25d, and a movable contact piece 25f is also formed so as to extend inward from the arm portion 25e. The front end portion of the movable contact piece 25f abuts against the upper surface of the IC lead 12b thereby to establish the electrical connection therebetween. Furthermore, an operation piece 25g is formed to the movable piece 25d on an outside portion thereof so as to project upward therefrom. The movable contact piece 25g of the contact pin 25 has a width H1, which is formed to be thinner than a width H2 of the springy portion 25c or other portion (see FIG. 9).

Figure 8:
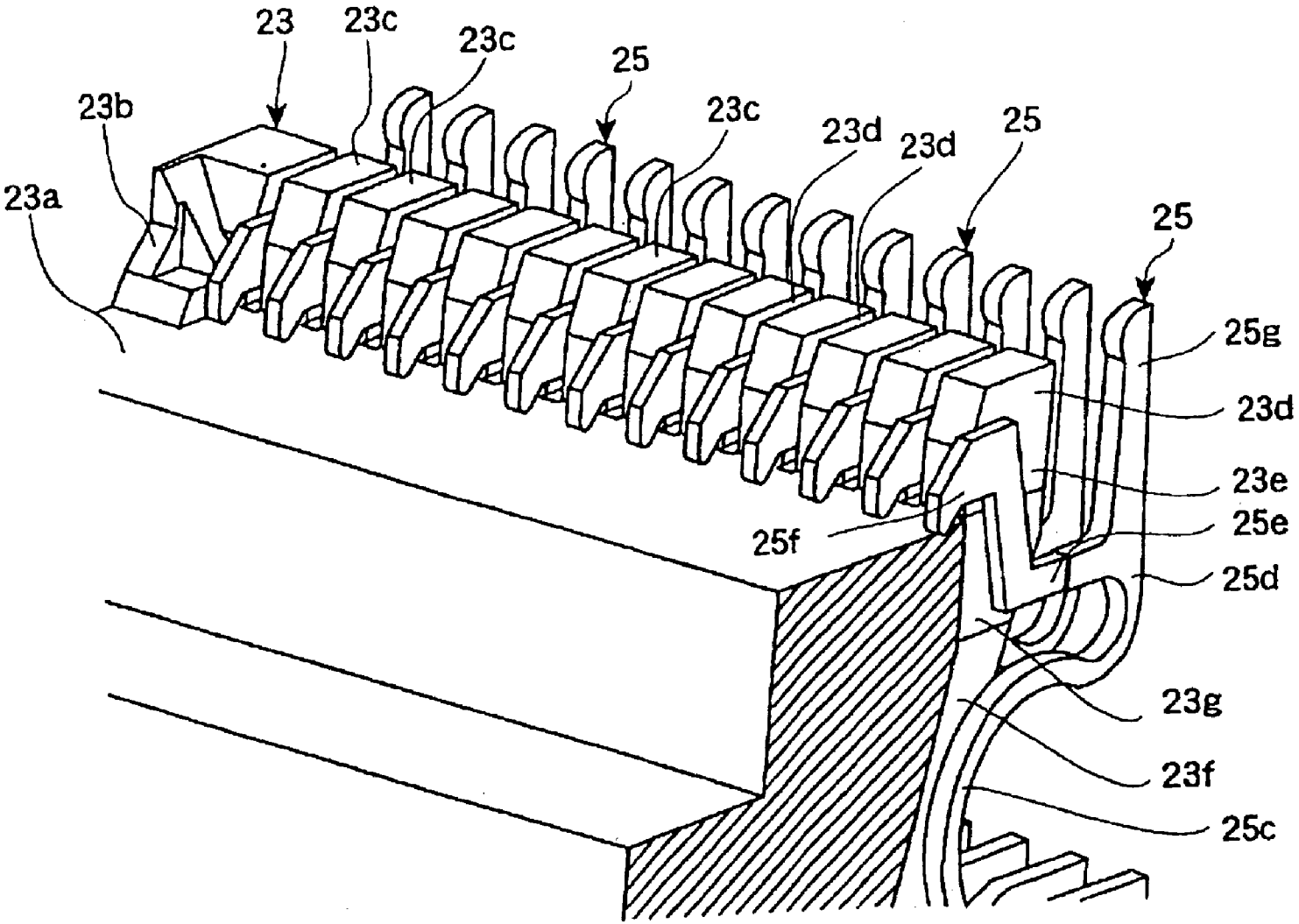
FIG. 8 is a perspective view showing a state that contact pins according to the second embodiment 2 are inserted into slits of the socket body.
Figure 9:
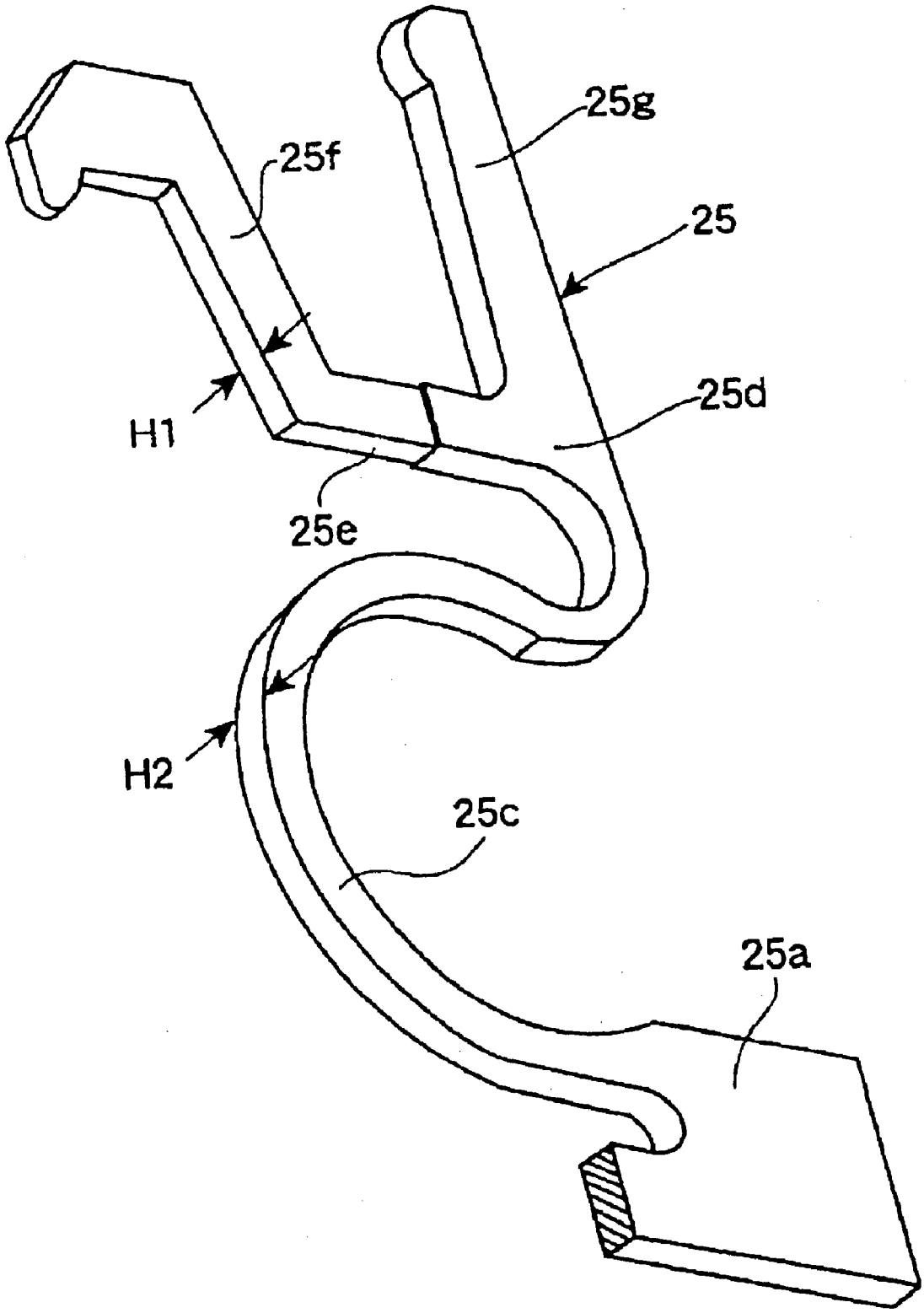
FIG. 9 is a perspective view showing a state that the contact pin of the second embodiment 2 is viewed from the obliquely lower side.
Figure 10:
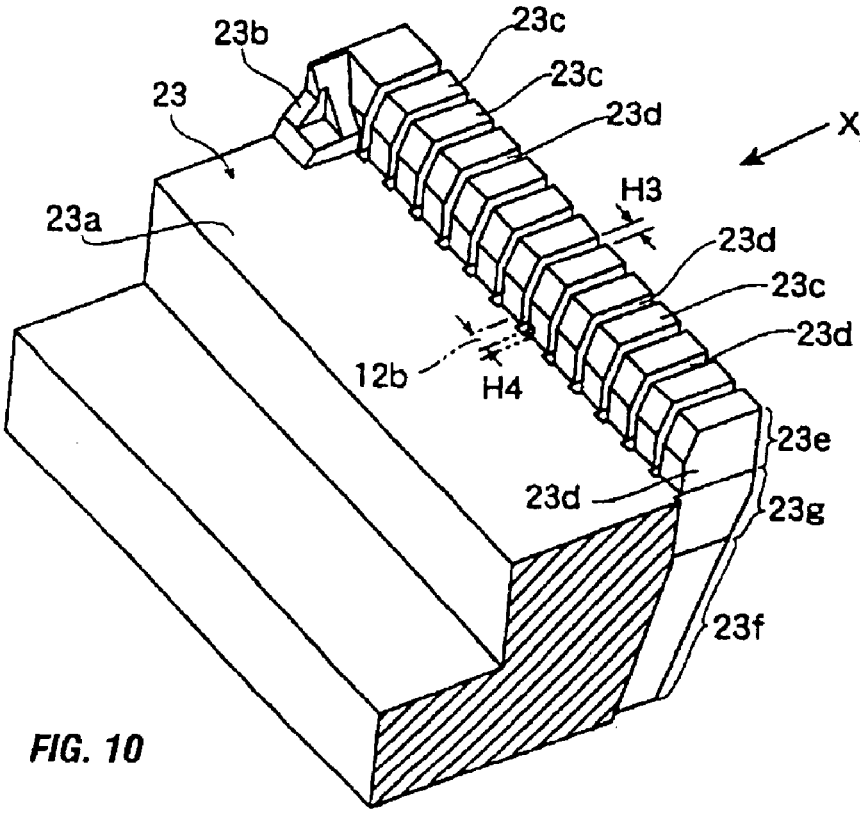
FIG. 10 is a perspective view showing slits, etc. of the socket body of the second embodiment 2.
Figure 11:
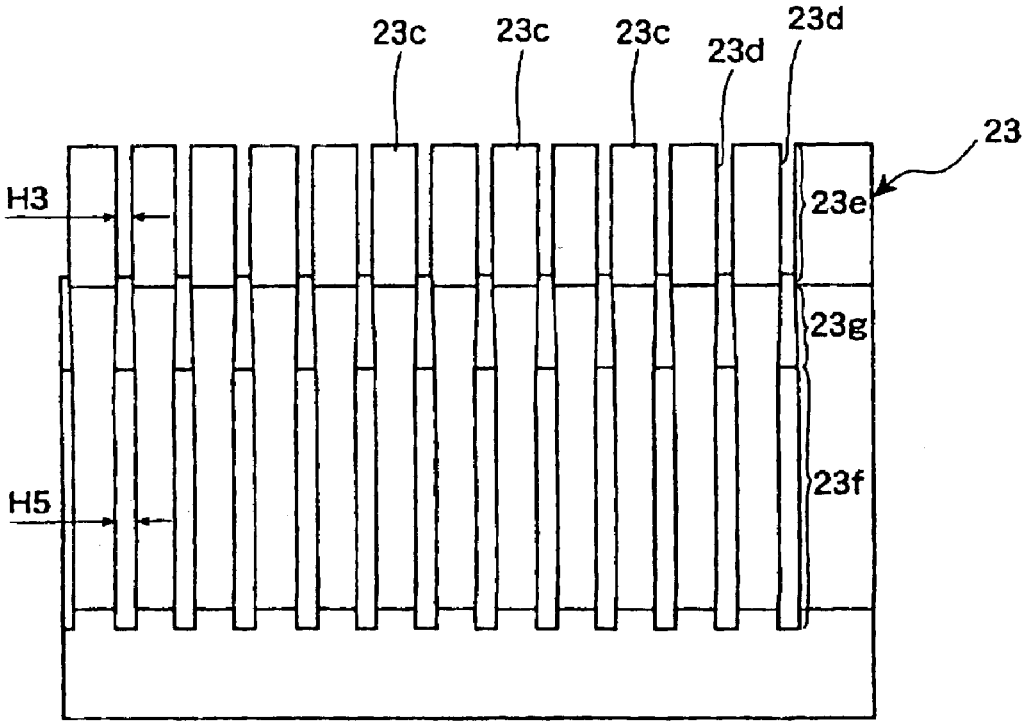
FIG. 11 is a perspective view, concerning the second embodiment 2, showing a state of FIG. 10 viewed from an arrow X.

A portion of such contact pin 25 is inserted into a slit 23d formed to the socket body 23 as concretely shown in FIG. 8, FIG. 10 and FIG. 11. The slit 23d has a width H3, at its upper portion 23e, upper side from the upper surface of the mount portion 23a, (which is slightly larger than the width H1 of the movable contact piece 25f of the contact pin 25), which is smaller than a width H4 of the IC lead 12b. The slit 23d also has a width H5, at its lower portion 23f, (which is slightly larger than the width H2 of the springy portion 25c of the contact pin 25), which is wider than the width H3 of the slit upper portion 23e. A slit intermediate portion 23g between these upper and lower slit portions 23e and 23f of the slit 23d is formed to provide a downward tapered surface so that the slit upper portion 23e and the slit lower portion 23f can provide smooth continuous connection.

The springy portion 25c of the contact pin 25 is inserted into the slit lower portion 23f and the movable contact piece 25f (portion having the width H1) is also inserted into the slit upper portion 23e and the slit intermediate portion 23g.

The front end portion of the movable contact piece 25f of the contact pin 25 projects on the side of the mount portion 23a as shown in FIG. 8 so as to contact the upper surface of the IC lead 12b.

Figure 4:
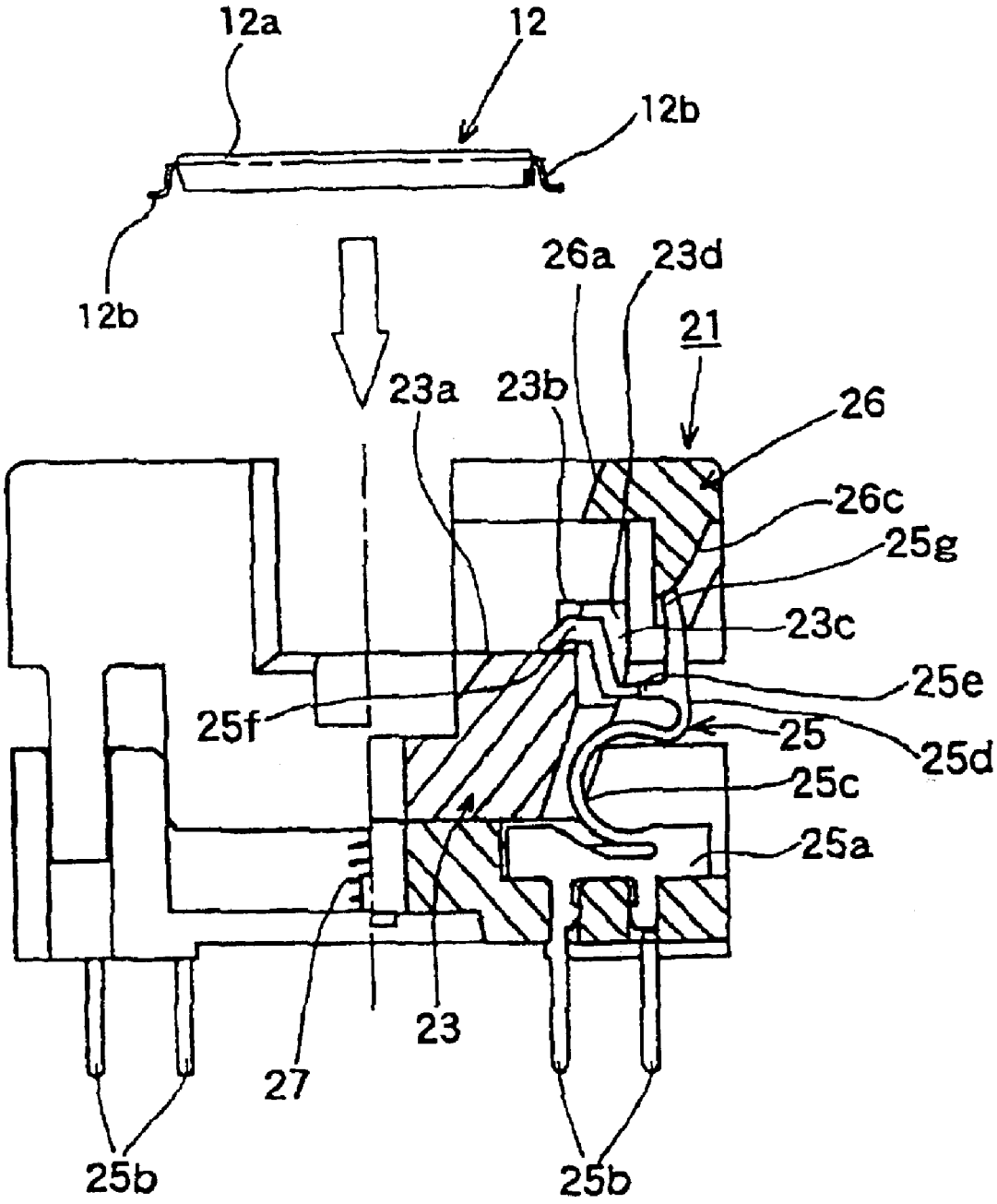
FIG. 4 is an elevational sectional view of an IC invention.
Figure 7:
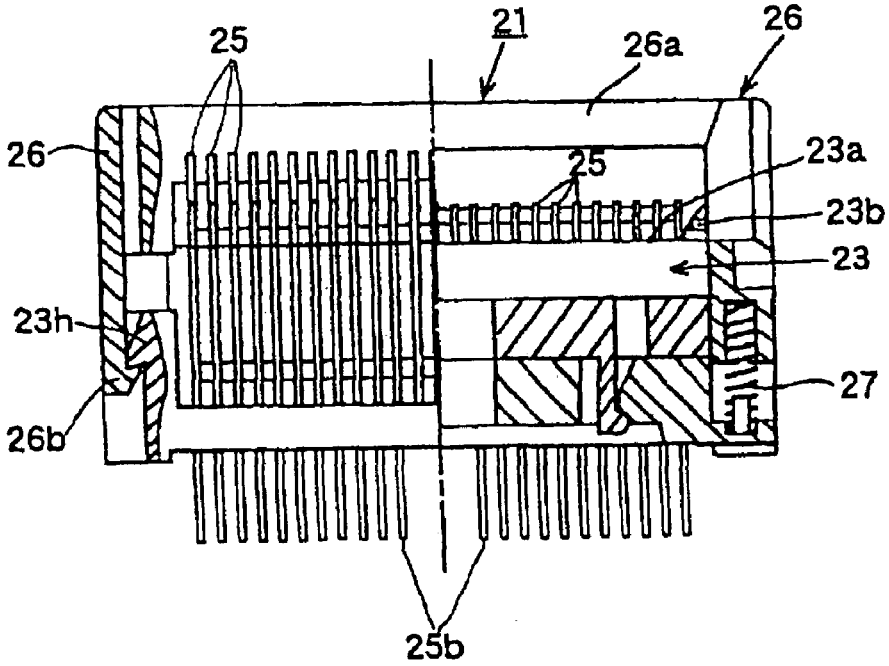
FIG. 7 is a side view, half in section, of the IC socket of the second embodiment 2.

The upper portion member 26 has, as shown in FIG. 4, an opening 26a having a size capable of being inserted with the IC package 12. The IC package 12 is inserted through this opening 26a and then mounted to the mount portion 23a of the socket body 23. The upper operation member 26 is provided, as shown in FIG. 7, for the socket body 23 to be vertically movable in a manner that the upper operation member 26 is urged upward by the spring 27, and an engaging claw portion 26b is engaged with an engagement portion 23h of the socket body 23 at the most upward position of the upper operation member 26 so as to prevent the upper operation member 26 from being disengaged. Furthermore, the upper operation member 26 is formed with a cam portion 26c slidably contacting the operation piece 25g of the contact pin 25, and when the upper operation member 26 is moved downward, the operation piece 25g of the contact pin 25 is pressed by the cam portion 26c of the upper operation member 26, the springy portion 25c is elastically deformed, and the movable contact piece 25f is displaced upward in the obliquely outer direction thereby to separate the contact pin 25 from the IC lead 12b. Further, when the upper operation member 26 is moved upward, in the manner reverse to that mentioned above, the movable contact piece 25f is displaced downwardly by the elastic force of the springy portion 25c and the movable contact piece 25f is hence contacted to the upper surface of the IC lead 12b thereby to establish the electrical connection therebetween.

The IC socket 21 of the structure mentioned above will be used in the manner which will be mentioned hereunder.

First, the lead portions 25b of the contact pins 25 of the IC socket 21 are preliminarily inserted into the insertion holes of the printed circuit board and then soldered, in this manner, a plurality of IC sockets 21 are arranged on the printed circuit board.

Then, such IC package 12 is set to the IC socket 21 by means of, for example, automatic machine thereby to establish an electrical connection.

That is, the upper operation member 26 is depressed and lowered by the automatic machine, with the IC package 12 being held, against the urging force of the spring 27 and the contact pins 25. In this moment, the operation pieces 25g of the contact pins 25 are pressed by the cam portion 26c of the upper operation member 26, the springy portion 25c is elastically deformed, the movable contact piece 25f is deformed obliquely upward to be maximally opened, and thereby, the movable contact pieces 25f are retired from the insertion range of the IC package 12 (see FIG. 5).

Figure 5:
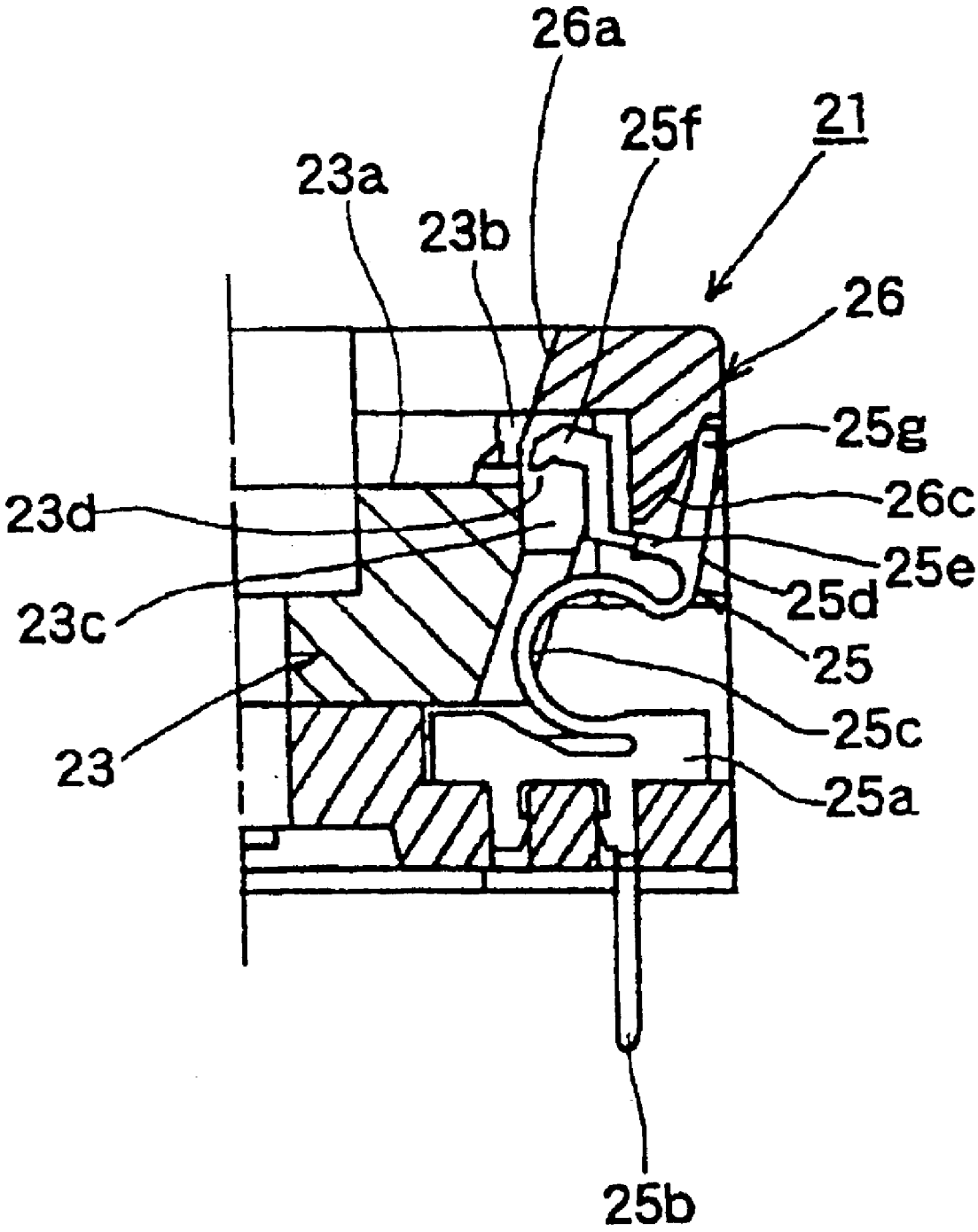
FIG. 5 is an elevational sectional view showing a state that an upper operation member is positioned at its most lowered position.
Figure 6:
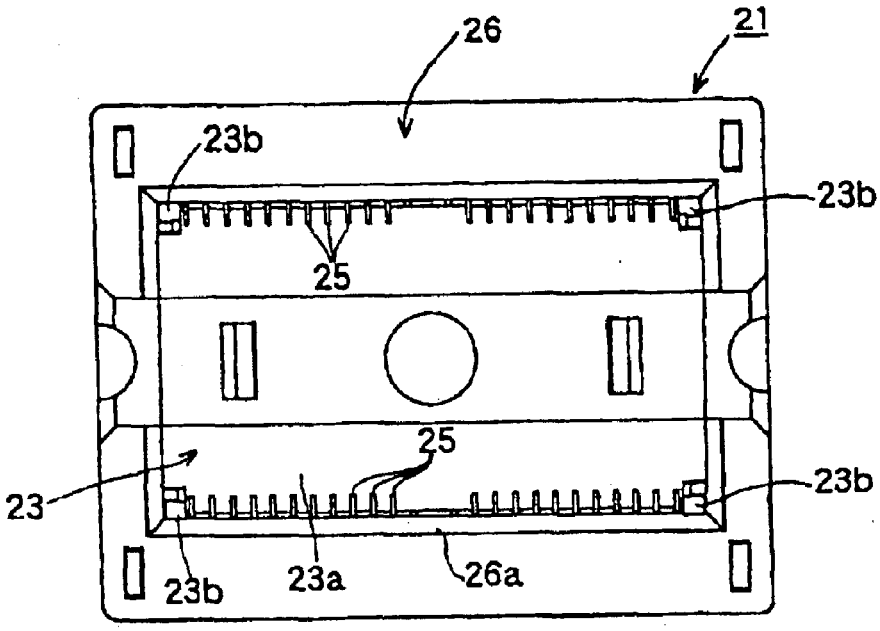
FIG. 6 is a plan view of the IC socket of the second embodiment 2.

Under the state mentioned above, the IC package 12 is released and mounted on the mount portion 23a of the socket body 23. At this time, although it is desired that the IC package 12 is mounted just on the predetermined position of the mount portion 23a of the socket body 23, the mounted position may be slightly shifted. In such case of shifting, the movable contact piece 25f is deformed, as shown in FIG. 5, in a direction obliquely upward and the slit upper portion 23e hence opened, so that, in a conventional structure, there is a possibility of the IC lead 12b being intruded into the slit upper portion 23e of the socket body 23. However, according to the present invention, since the width H3 of the slit upper portion 23e is formed to be narrower than the width H4 of the IC lead 12b, so that the IC lead 12b can be prevented from intruding into the slit upper portion 23e of the socket body 23 and, hence, prevented from being deformed or damaged.

Further, the IC package 12 is corrected in its attitude to take a horizontal state, and at the same time, the horizontal position of the IC package 12 is determined by means of the guide portion 23b so as to be surely positioned to a predetermined portion on the mount portion 23a of the socket body 23.

Next, when the pressing force of the automatic machine to the upper operation member 26 is released, the upper operation member 26 is moved upward by the urging force of the spring 27 or other force and the movable contact piece 25f of the contact pin 25 is returned by the elastic force of the springy portion 25c. In such operation, at a time when the upper operation member 26 is moved upward to a predetermined position, the movable contact piece 25f of the contact pin 25 abuts against the upper surface of the predetermined IC lead 12b of the IC package 12 which has been positioned in the manner mentioned above thereby to establish an electrical connection therebetween.

By the way, since the contact pin 25 is formed in a manner that the width H1 of the movable contact piece 25f is smaller than the width H2 of the springy portion 25c and the movable contact piece 25f is inserted into the slit upper portion 23e of the socket body 23 having the narrow width H3, the following merits or advantages will be achieved.

That is, when it is required to make small the IC package 12 without changing the number of the IC leads 12b, the width H4 of each of the IC leads 12b is inevitably made small, and in order to prevent the IC lead 12b from intruding into the slit upper portion 23e, it is necessary to make smaller the width H3 of the slit upper portion 23e of the socket body 23. Accordingly, in order to insert the movable contact piece 25f of the contact pin 25 into the slit upper portion 23e having the narrow width H3, it is also necessary to make considerably small the width H1 of the movable contact piece 25f itself. In a case where the springy portion 25c is formed with the same width as that of such movable contact piece 25f, the spring force will be made weak. Thus, according to the present invention, the width H2 of the springy portion 25c is made wider than the width H1 of the movable contact piece 25f thereby to ensure the sufficient spring force as well as to allow the movable contact piece 25f to be inserted into the slit upper portion 23e.

In the viewpoint of moldability of the slit 23d of the socket body 23, the width H3 of the slit upper portion 23e is made narrow, the width H5 of the slit lower portion is made wider than the width H3, and the portion between the slit upper portion 23e and the slit lower portion 23f are formed to be continuous through the tapered intermediate portion 23g, so that, in comparison with the structure in which the slit 23d is formed with the same width H3, the moldability in an injection molding process can be improved.

Third Embodiment 3

Figure 13:
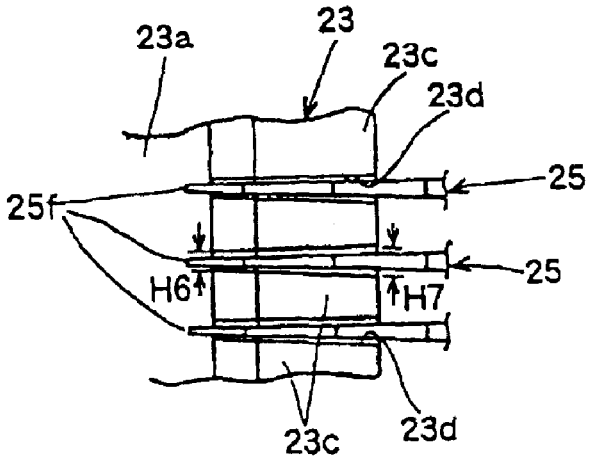
FIG. 13 is a plan view, representing a third embodiment 3 of the present invention, showing a state of the insertion of contact pins into a socket body.
Figure 14:
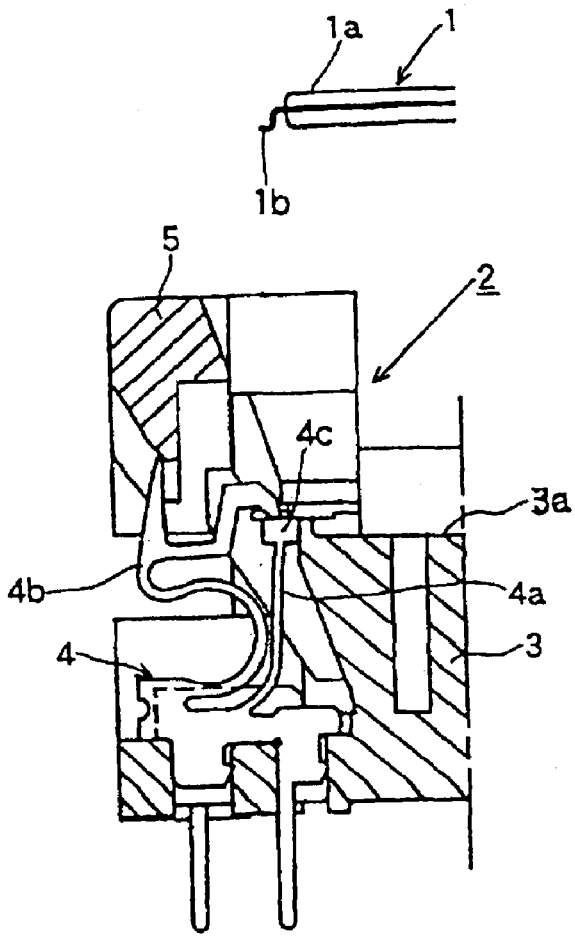
FIG. 14 (Prior Art)
FIG. 14 is a sectional view of a conventional example corresponding to FIG. 1.
Figure 15:
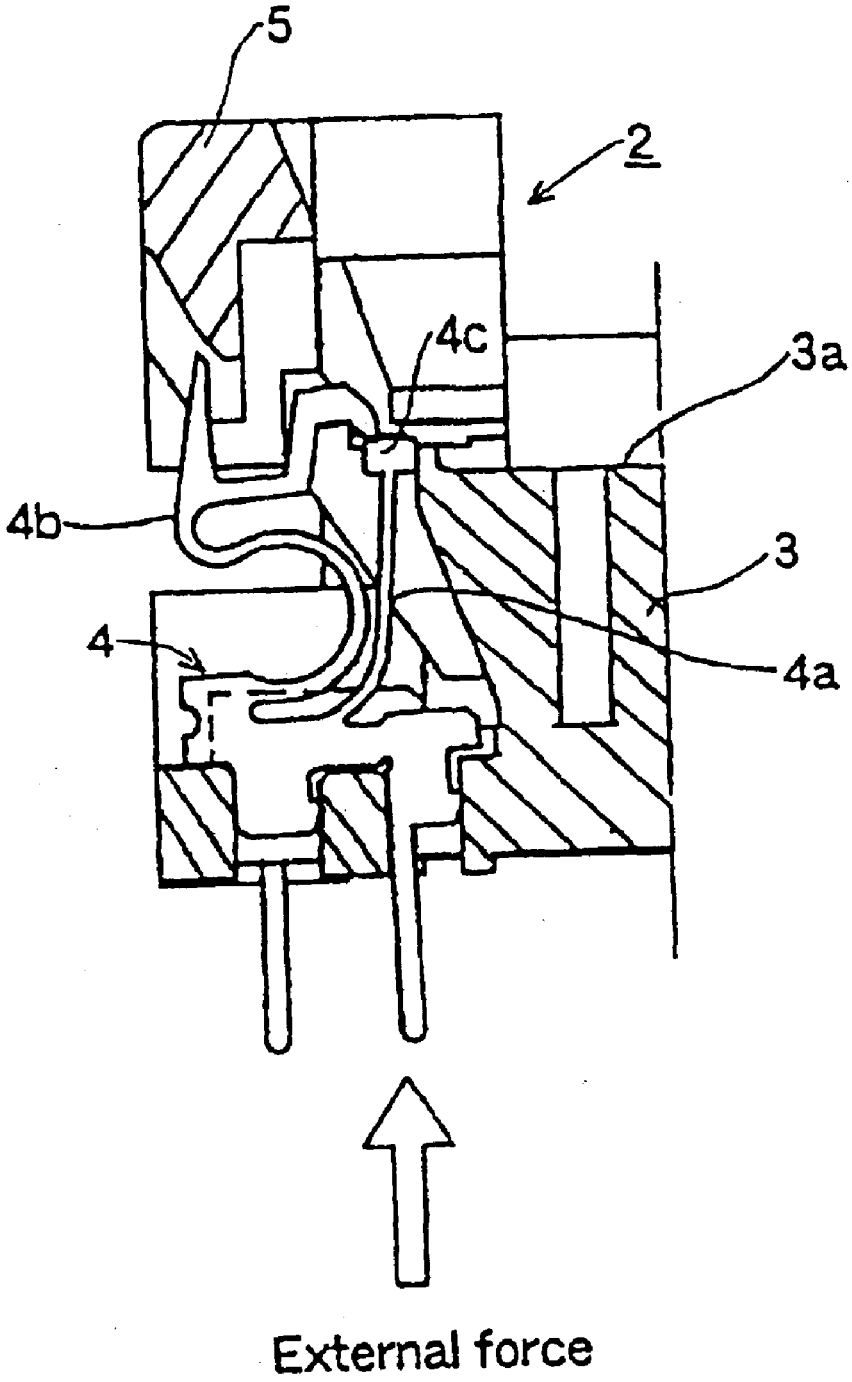
FIG. 15 (Prior Art)
FIG. 15 is a sectional view of the conventional example of FIG. 14, in which the contact pin is raised.
Figure 16:
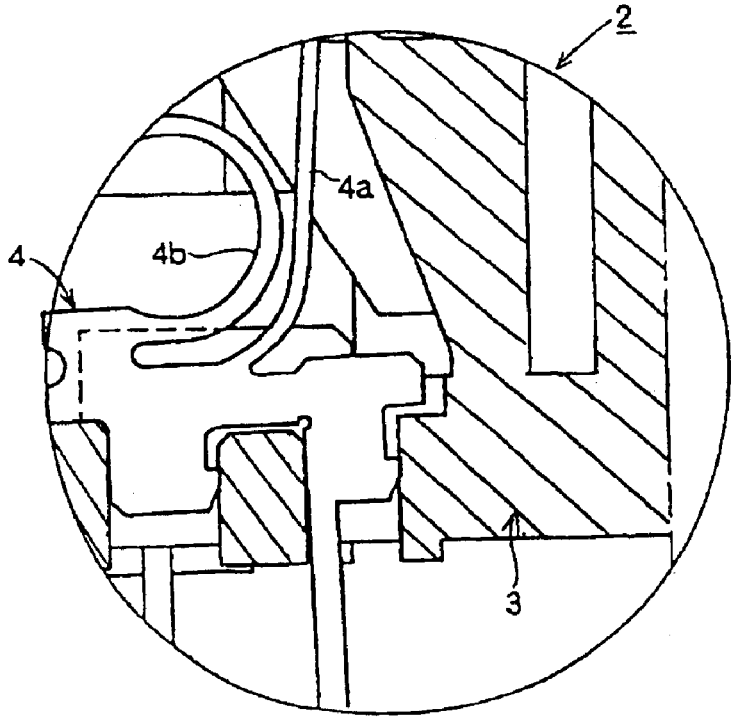
FIG. 16 (Prior Art)
FIG. 16 is an enlarged sectional view showing a portion in the conventional example at which the contact pin is raised.
Figure 17:
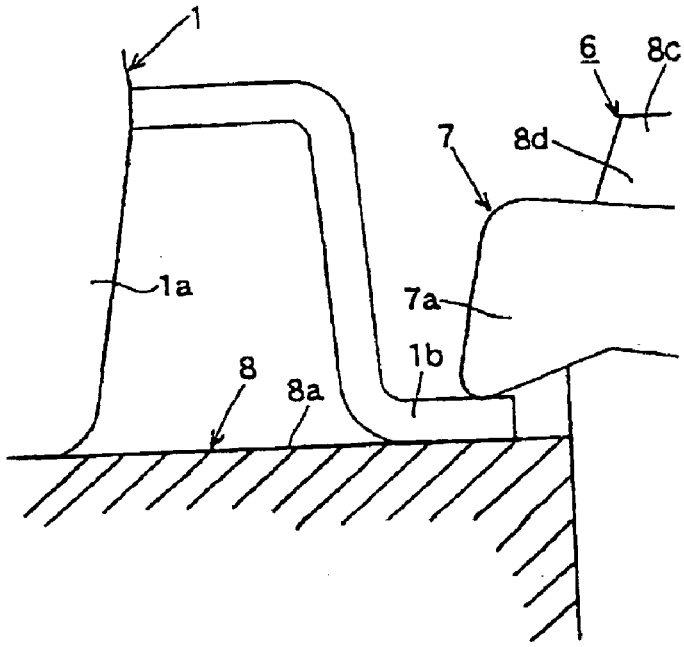
FIG. 17 (Prior Art)
FIG. 17 is an enlarged sectional view showing another conventional example of a state in which a contact pin contacts a lead pin.
Figure 18:
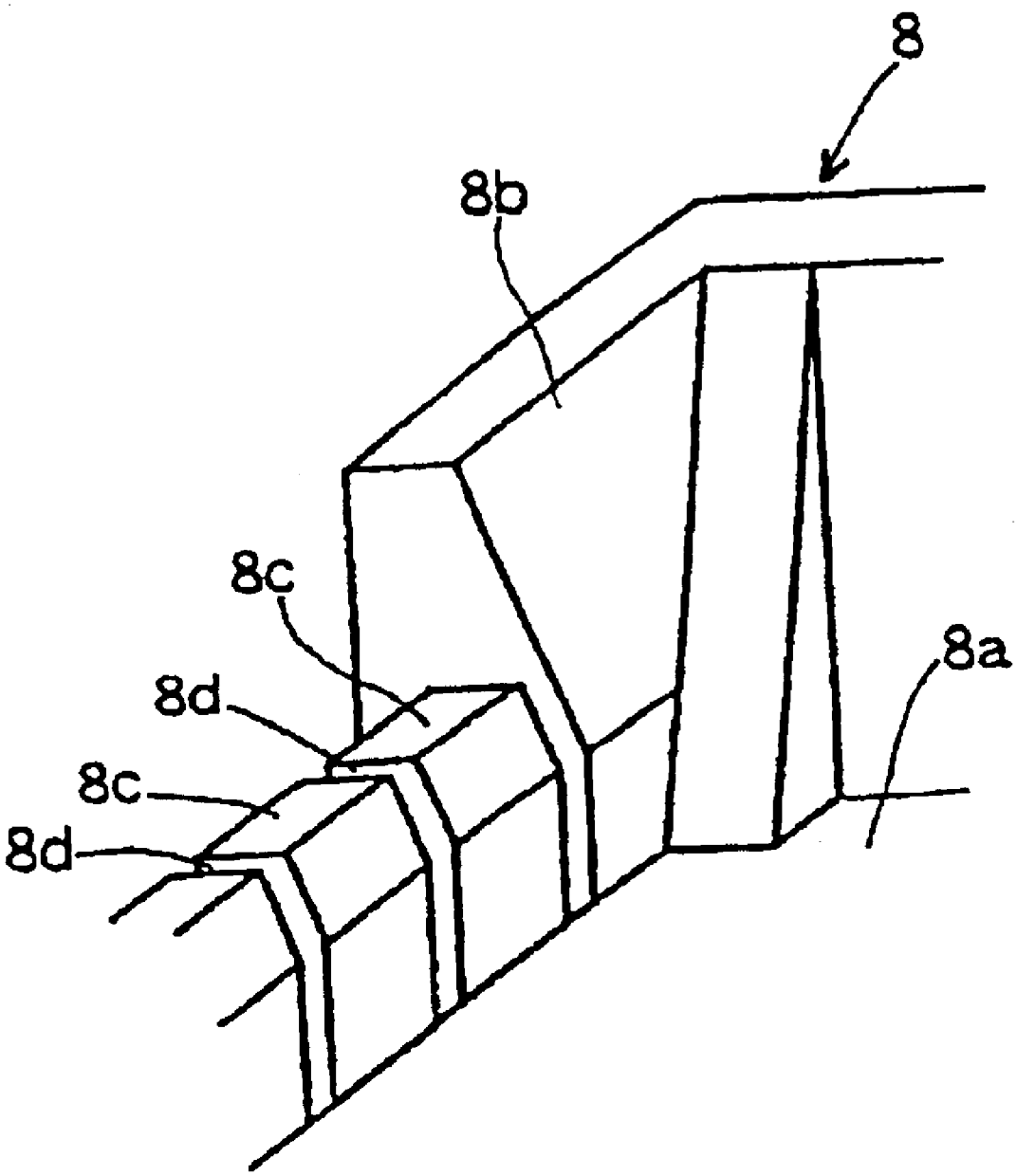
FIG. 18 (Prior Art)
FIG. 18 is a perspective view of slits etc. of a socket body of the above another conventional example.

FIG. 13 shows a third embodiment 3 of the present invention, which is a plan view showing a state that the contact pin 25 is inserted into the slit upper portion 23e of the socket body 23.

Figure 12A:
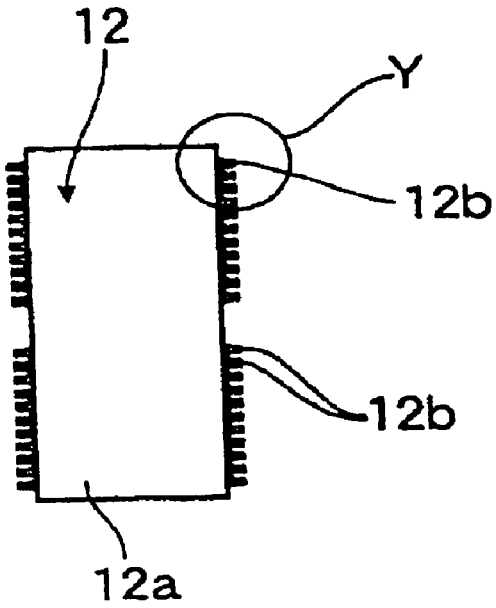
FIG. 12 includes views of the IC package of the second embodiment 2, in which (a) is a plan view of the IC package and (b) is an enlarged view of a portion Y in (a).
Figure 12B:
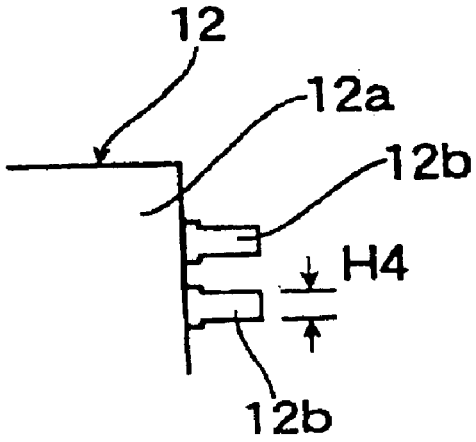

With reference to this FIG. 13, the slit upper portion 23e of the socket body 23 is formed such that the width H6 on the mount portion side (inside) is made smaller than the width H4 of the IC lead 12b (see FIG. 12(b)) so as to prevent the IC lead 12b from intruding into the slit upper portion and the width H7 outside the slit upper portion 23e is made to be larger than the inside width H6 thereby to provide a surface tapered so as to be opened apart from the mount portion 23a.

Then, the movable contact piece 25f of the contact pin 25 is therefore formed to have a tapered surface corresponding to the tapered surface of the slit upper portion 23e.

By forming the movable contact piece 25f so as to provide a smooth tapered surface, the contact pin can be relatively easily manufactured.

Structures and functions of this third embodiment other than those mentioned above are substantially the same as those of the second embodiment 2, so that the details thereof are now omitted herein.

Further, it is to be noted that although, in the above various embodiments, the present invention is applied to the IC socket 11 or 21 as "electrical part", it is apparent that the present invention is not limited to it and is applicable to another device or apparatus. Furthermore, although the contact pin 25 in the above embodiments 2 and 3 is provided with the movable contact piece 25f and with no stationary contact piece, the contact pin 25 in these embodiments may be formed with a stationary contact pin as a two-point contact type contact pin in which each terminal of the electrical part is clamped from upper and lower sides thereof by these stationary contact piece and the movable contact piece.

Possibility of Industrial Utilization

As mentioned above, the socket for electrical parts according to the present invention is preferably usable as an IC socket to which an IC package can be detachably mounted and suitable for detachably holding the electrical parts.

What is claimed is:

1. A socket for an electrical part comprising:

a socket body provided with a mount portion on which an electrical part is mounted;

a plurality of contact pins attached to the socket body so as to restrict a downward movement of the contact pins with respect to the socket body, each of said pins being connected to a terminal of the electrical part so as to establish an electrical connection between the contact pin and the terminal; and an operation member provided for the socket body to be vertically movable with respect to the socket body, each of said contact pins being formed with a stationary contact piece having a stationary contact portion contacting a lower surface of the terminal of the electrical part and a moveable piece having a movable contact portion contacting an upper surface of the terminal of the electrical part, said movable contact portion being contacted to or separated from the terminal of the electrical part in response to a vertical movement of the operation member, and said stationary contact piece of the contact pin being provided with an engagement portion and said socket body being formed with an engaging portion to be engaged with an upper surface of said engagement portion to thereby limit an upper movement of the stationary contact piece.

2. The socket for an electrical part according to claim 1, wherein said socket body comprises a base member to which said contact pins are attached and a seating plate to which the mount portion is formed, said seating plate being formed with the engaging portion, and when said seating plate is mounted to said base member, said engagement portion of the contact pin is engaged with said engaging portion.

3. The socket for an electrical part according to claim 1, wherein said seating plate is formed with a guide portion for guiding said stationary contact piece so as to engage the engagement portion of the contact pin with the engaging portion of the seating plate when said seating plate is mounted to the base member.

4. The socket for an electrical part according to claim 1, wherein said stationary contact piece is formed with a springy portion which is elastically deformable against a force in a vertical direction.

5. A socket for an electrical part comprising:

a socket body provided with a mount portion to which the electrical part is mounted;

a plurality of contact pins attached to the socket body so as to restrict a downward movement of the contact pins with respect to the socket body, each of said contact pins being connected to a terminal of the electrical part so as to establish an electrical connection between the contact pin and the terminal; and an operation member for the socket body operable to be moved vertically with respect to the socket body, each of said contact pins being formed with a stationary contact piece having a stationary contact portion contacting a lower surface of the terminal of the electrical part and a movable contact piece having a movable contact portion contacting an upper surface of the terminal of the electrical part, said movable contact portion being contacted to and separated from the terminal of the electrical part with the movable contact portion being moved in response to a vertical movement of the operation member, and said stationary contact piece of the contact pin being provided with an engagement portion protruding substantially vertically from a side surface of the stationary contact piece, and said socket body being formed with an engaging portion having a lower surface being engaged with an upper surface of said engagement portion of the stationary contact piece to thereby correctly maintain an attitude of the stationary contact piece.

*6. A socket for an electrical part comprising:*

*a socket body provided with a mount portion on which an electrical part is mounted;*

*a plurality of contact pins attached to the socket body so as to restrict a downward movement of the contact pins with respect to the socket body, each of said pins being connected to a terminal of the electrical part so as to establish an electrical connection between the contact pin and the terminal; and*

*an operation member provided for the socket body to be vertically movable with respect to the socket body,*

*each of said contact pins being formed with a stationary contact piece having a stationary portion contacting a lower surface of the terminal of the electrical part and a movable piece having a movable portion contacting an upper surface of the terminal of the electrical part,*

*said movable contact portion being contacted to or separated from the terminal of the electrical part in response to a vertical movement of the operation member, and*

*an engagement portion being formed in the vicinity of the mount portion and engaged with an upper surface of an engagement portion formed on the stationary contact piece of the contact pin to thereby limit an upper movement of the stationary contact piece.*

* * * * *

UNITED STATES PATENT AND TRADEMARK OFFICE

CERTIFICATE OF CORRECTION

PATENT NO. : RE 39,230 E
APPLICATION NO. : 10/207818
DATED : August 8, 2006
INVENTOR(S) : Hideo Shimada It is certified that error appears in the above-identified patent and that said Letters Patent is hereby corrected as shown below:

On Title page
Item (57) Abstract

Col. 2, line 1
delete "An socket" and insert --A socket-- therefor.

Signed and Sealed this

Second Day of January, 2007

JON W. DUDAS
*Director of the United States Patent and Trademark Office*